US010347734B2

(12) United States Patent
Shimizu et al.

(10) Patent No.: US 10,347,734 B2
(45) Date of Patent: Jul. 9, 2019

(54) SEMICONDUCTOR DEVICE, POWER SUPPLY CIRCUIT, AND COMPUTER

(71) Applicant: Kabushiki Kaisha Toshiba, Minato-ku (JP)

(72) Inventors: Tatsuo Shimizu, Shinagawa (JP); Hisashi Saito, Kawasaki (JP); Hiroshi Ono, Setagaya (JP); Toshiya Yonehara, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/889,431

(22) Filed: Feb. 6, 2018

(65) Prior Publication Data

US 2018/0308950 A1  Oct. 25, 2018

(51) Int. Cl.
    H01L 29/15   (2006.01)
    H01L 29/51   (2006.01)
    H01L 29/49   (2006.01)
    H01L 29/778  (2006.01)
    H01L 21/225  (2006.01)
    H01L 21/28   (2006.01)
    (Continued)

(52) U.S. Cl.
    CPC ........ H01L 29/513 (2013.01); H01L 21/2258 (2013.01); H01L 21/28264 (2013.01); H01L 29/41775 (2013.01); H01L 29/4916 (2013.01); H01L 29/4966 (2013.01); H01L 29/517 (2013.01); H01L 29/518 (2013.01); H01L 29/7787 (2013.01); *H01L 29/4236* (2013.01)

(58) Field of Classification Search
    CPC .................................................. H01L 29/513

USPC ......................................................... 257/76
See application file for complete search history.

(56) References Cited

U.S. PATENT DOCUMENTS 9,728,608 B2     8/2017  Shimizu et al.
2014/0183580 A1*  7/2014  Udagawa ............ H01L 21/0237
                                                      257/94
2014/0329367 A1  11/2014  Sheppard et al.
(Continued)

FOREIGN PATENT DOCUMENTS

JP    5270562       8/2013
JP    5926216       5/2016
JP    2016-181673  10/2016

OTHER PUBLICATIONS

Bin Lu, et al., "High-Performance Integrated Dual-Gate AlGaN/GaN Enhancement-Mode Transistor," IEEE Electron Device Letters, vol. 31, No. 9, Sep. 2010, pp. 990-992.

*Primary Examiner* — Ajay Arora
(74) *Attorney, Agent, or Firm* — Oblon, McClelland, Maier & Neustadt, L.L.P.

(57) ABSTRACT

A semiconductor device includes a nitride semiconductor layer, a first electrode and second electrode on the nitride semiconductor layer, a gate electrode, and a gate insulating layer between the nitride semiconductor layer and the gate electrode. The gate insulating layer has a first oxide region containing at least any one element of aluminum and boron, gallium, and silicon. When a distance between the first end portion and the second end portion of the first oxide region is defined as d1, and a position separated by d1/10 from the first end portion toward the second end portion is defined as a first position, an atomic concentration of gallium at the first position is 80% or more and 120% or less of that of the at least any one element.

20 Claims, 15 Drawing Sheets

(51) Int. Cl.
*H01L 29/417* (2006.01)
*H01L 29/423* (2006.01)

(56) References Cited

U.S. PATENT DOCUMENTS

2016/0284804 A1 9/2016 Shimizu et al.
2017/0301760 A1 10/2017 Shimizu et al.

* cited by examiner

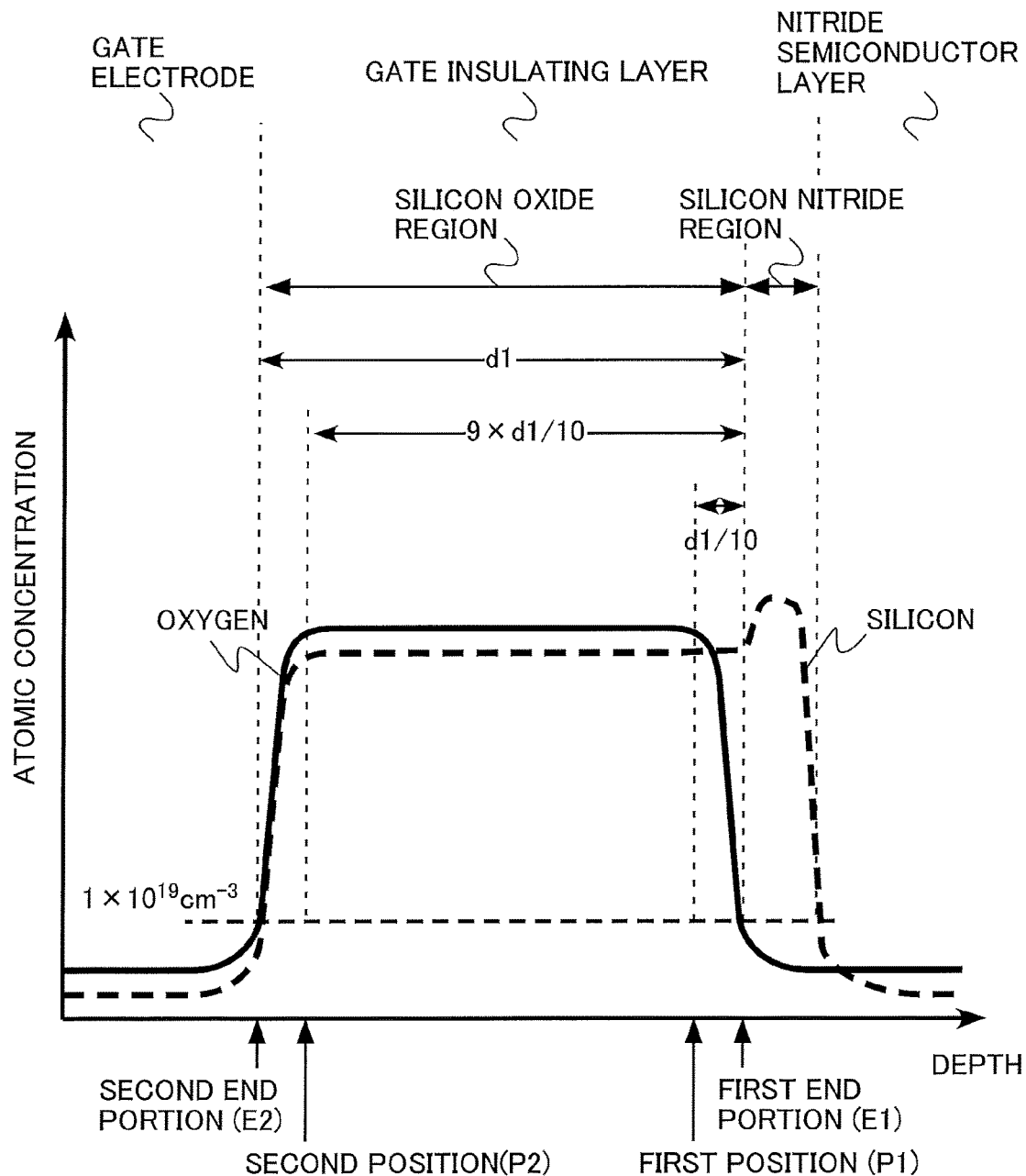

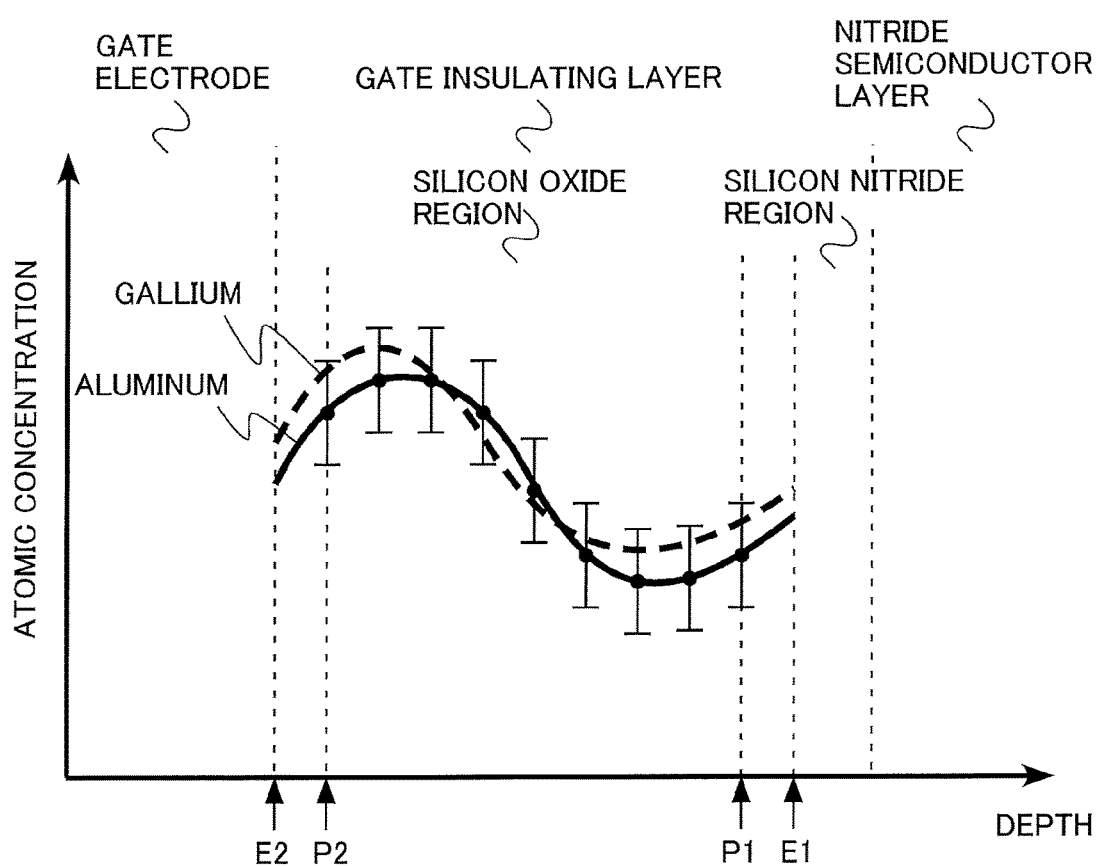

Al (or B) in SiO$_2$

Ga in SiO$_2$

SEMICONDUCTOR DEVICE, POWER SUPPLY CIRCUIT, AND COMPUTER

CROSS-REFERENCE TO RELATED APPLICATION

This application is based upon and claims the benefit of priority from Japanese Patent Application No. 2017-085423, filed on Apr. 24, 2017, the entire contents of which are incorporated herein by reference.

FIELD

Embodiments described herein relate generally to a semiconductor device, a power supply circuit, and a computer.

BACKGROUND

Semiconductor elements such as a transistor and a diode are used in circuits for a switching power supply and an inverter. These semiconductor elements require a high breakdown voltage and a low on-resistance. The relationship between the breakdown voltage and the on-resistance is a trade-off relationship determined by a semiconductor material used for the semiconductor elements.

With the progress of technological development so far, the semiconductor element realizes the low on-resistance near the limit of silicon which is the major semiconductor material. To further increase the breakdown voltage or further reduce the on-resistance, there is a need to change the semiconductor material.

Nitride semiconductors such as gallium nitride and aluminum gallium nitride have a bandgap larger than that of silicon. By using the nitride semiconductor, the trade-off relationship determined by the semiconductor material can be improved and the dramatic high breakdown voltage or low on-resistance can be realized.

In the transistor using the nitride semiconductor, a fluctuation in threshold voltage may occur due to application of voltage stress. It is expected to realize a transistor capable of realizing high reliability by suppressing the fluctuation in the threshold voltage.

BRIEF DESCRIPTION OF THE DRAWINGS

FIG. 3 is an explanatory diagram of the gate structure according to the first embodiment;

FIG. 4 is an explanatory diagram of the gate structure according to the first embodiment;

DETAILED DESCRIPTION

Figure 1:
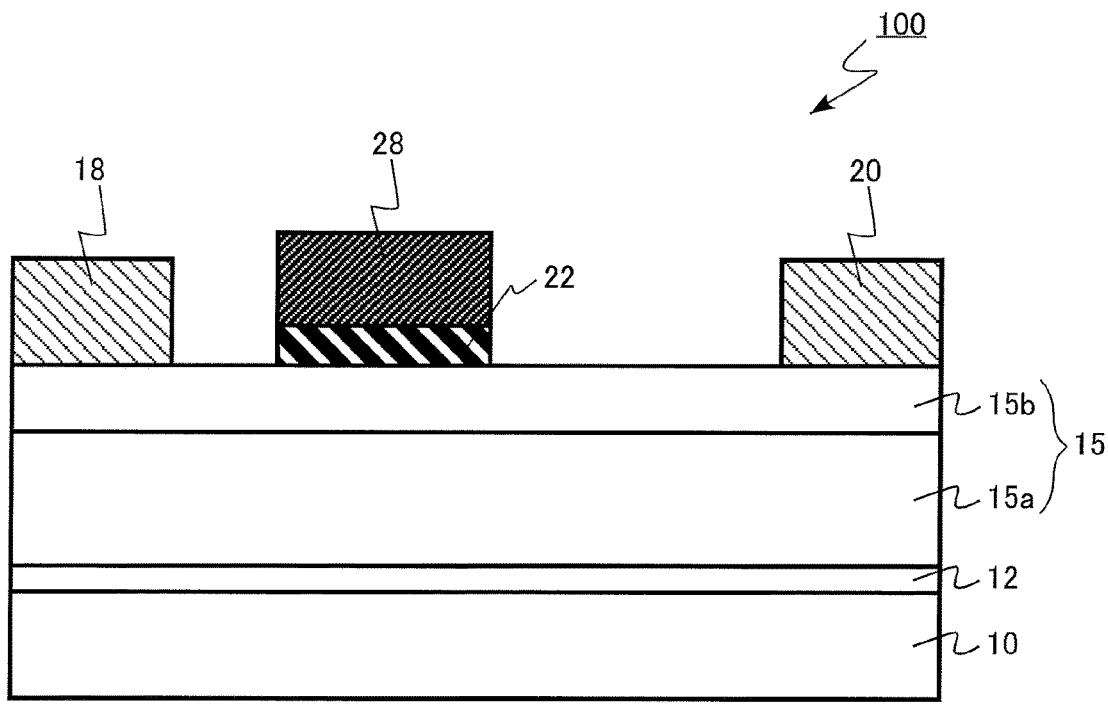
FIG. 1 is a schematic cross-sectional view of a semiconductor device according to a first embodiment.

A semiconductor device according to an aspect of the present disclosure includes a nitride semiconductor layer containing gallium (Ga); a first electrode disposed on or above the nitride semiconductor layer; a second electrode disposed on or above the nitride semiconductor layer; a gate electrode disposed between the first electrode and the second electrode; and a gate insulating layer disposed between the nitride semiconductor layer and the gate electrode, the gate insulating layer including a first oxide region containing gallium (Ga), silicon (Si), and at least any one element of aluminum (Al) and boron (B), wherein when an end portion of the first oxide region facing the nitride semiconductor layer is defined as a first end portion, an end portion of the first oxide region facing the gate electrode is defined as a second end portion, a distance between the first end portion and the second end portion is defined as d1, and a position separated by d1/10 from the first end portion toward the second end portion is defined as a first position, an atomic concentration of gallium at the first position is 80% or more and 120% or less of an atomic concentration of the at least any one element.

In the present specification, the same or like members are denoted by the same reference numerals and the overlapping description thereof may be omitted.

In the present specification, "undoped" means that an impurity concentration is $1 \times 10^{15}$ cm$^{-3}$ or less.

In the present specification, the upper direction in the drawings is described as "upper" and the lower direction in the drawings is described as "lower" in order to show the positional relationship of the parts and the like. In the present specification, the terms "upper" and "lower" are not necessarily terms indicating the relationship with the direction of gravity.

First Embodiment

A semiconductor device according to a first embodiment includes a nitride semiconductor layer containing gallium (Ga) and including a first nitride semiconductor region and a second nitride semiconductor region having a bandgap larger than that of the first nitride semiconductor region, a gate electrode, a first electrode disposed on the nitride semiconductor layer, a second electrode disposed on the nitride semiconductor layer and having the gate electrode disposed between the first electrode and the second electrode, and a gate insulating layer disposed between the nitride semiconductor layer and the gate electrode and including a first oxide region containing gallium (Ga), silicon (Si), and at least any one element of aluminum (Al) and boron (B). When an end portion of a side of the nitride semiconductor layer of the first oxide region is defined as a first end portion, an end portion of a side of the gate electrode of the first oxide region is defined as a second end portion, a distance between the first end portion and the second end portion is defined as d1, and a position separated by d1/10 from the first end portion toward the second end portion is defined as a first position, an atomic concentration of gallium at the first position is 80% or more and 120% or less of that of the at least any one element.

FIG. 1 is a schematic cross-sectional view of the semiconductor device according to the first embodiment. The semiconductor device according to the first embodiment is a high electron mobility transistor (HEMT) 100 using a III-V group semiconductor.

As shown in FIG. 1, the HEMT (semiconductor device) 100 includes a substrate 10, a buffer layer 12, a nitride semiconductor layer 15, a source electrode 18 (first electrode), a drain electrode 20 (second electrode), agate insulating layer 22, and a gate electrode 28. The nitride semiconductor layer 15 includes a channel layer 15a (first nitride semiconductor region) and a barrier layer 15b (second nitride semiconductor region).

The substrate 10 is, for example, silicon of which the plane orientation of the surface is (111). In addition to the silicon, for example, sapphire or silicon carbide can also be applied.

The buffer layer 12 is provided on the substrate 10. The buffer layer 12 serves to alleviate a lattice mismatch between the substrate 10 and the channel layer 15a. The buffer layer 12 is made of, for example, aluminum nitride and aluminum gallium nitride.

The nitride semiconductor layer 15 is a nitride semiconductor containing gallium (Ga).

The channel layer 15a is provided on the buffer layer 12. The channel layer 15a is also referred to as an electron transit layer.

The channel layer 15a is, for example, undoped $Al_XGa_{1-X}N$ ($0 \leq X < 1$). More specifically, the channel layer 15a is, for example, undoped gallium nitride (GaN). A thickness of the channel layer 15a is, for example, 0.1 μm or more and 10 μm or less.

The barrier layer 15b is provided on the channel layer 15a. The barrier layer 15b is also referred to as an electron supply layer. A bandgap of the barrier layer 15b is larger than that of the channel layer 15a.

The barrier layer 15b having the large bandgap has a lattice constant different from that of the channel layer 15a. For this reason, a distortion occurs and a polarization is generated by a piezo effect. A band of the channel layer 15a is pushed down by an internal electric field caused by the polarization and two dimensional electron gas (2DEG) is formed as an inversion layer.

The barrier layer 15b is, for example, undoped or n-type $Al_YGa_{1-Y}N$ ($0<Y \leq 1$, $X<Y$). The barrier layer 15b is, for example, undoped aluminum gallium nitride. More specifically, for example, the barrier layer 15b is undoped $Al_{0.2}Ga_{0.8}N$. A thickness of the barrier layer 15b is, for example, 1 nm or more and 50 nm or less.

A heterojunction interface is formed between the channel layer 15a and the barrier layer 15b. The 2DEG is formed on the channel layer 15a by a polarized charge at the heterojunction interface. The 2DEG has high electron mobility and can realize a low on-resistance and high speed switching during the operation of the device.

The gate insulating layer 22 is provided on the barrier layer 15b. The gate insulating layer 22 has oxide containing silicon (Si). The gate insulating layer 22 serves to suppress a leak current between the nitride semiconductor layer 15 and the gate electrode 28. The gate insulating layer 22 may have a single layer structure or a stacked structure of different kinds of layers.

The gate electrode 28 is provided on the gate insulating layer 22. The gate electrode 28 is provided between the source electrode 18 and the drain electrode 20.

The gate electrode 28 is, for example, a metal electrode. The gate electrode 28 is, for example, titanium nitride.

The source electrode 18 is provided on the barrier layer 15b. The source electrode 18 is, for example, a metal electrode. The source electrode 18 has, for example, a stacked structure of titanium (Ti)/aluminum (Al)/titanium (Ti).

The drain electrode 20 is provided on the barrier layer 15b. The drain electrode 20 is, for example, a metal electrode. The drain electrode 20 has, for example, a stacked structure of titanium (Ti)/aluminum (Al)/titanium (Ti).

A distance between the source electrode 18 and the drain electrode 20 is, for example, 3 μm or more and 80 μm or less.

For example, an interlayer insulating layer (not shown) may be formed on the gate electrode 28 and the nitride semiconductor layer 15. The interlayer insulating layer is, for example, a silicon nitride layer. A wiring layer which is connected to, for example, the gate electrode 28, the source electrode 18, or the drain electrode 20 may be formed on the interlayer insulating layer.

In addition, an element isolation region formed by, for example, argon ion implantation may be provided in the channel layer 15a between the HEMT 100 and elements adjacent thereto.

Figure 2:
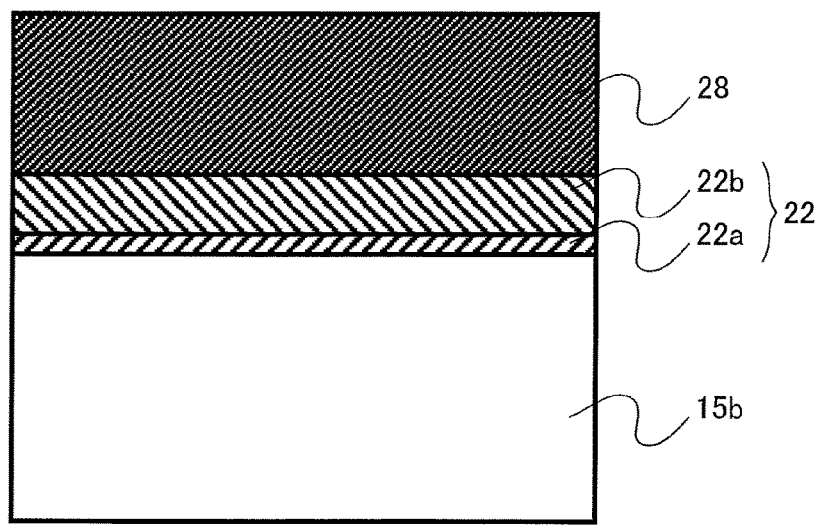
FIG. 2 is an explanatory diagram of a gate structure according to the first embodiment.

FIGS. 2 and 3 are explanatory diagrams of a gate structure according to the first embodiment. FIG. 2 is a schematic enlarged cross-sectional view of the gate structure. FIG. 3 is an atomic concentration profile of oxygen in a depth direction of the gate structure. The depth direction is a direction from the gate electrode 28 toward the nitride semiconductor layer 15.

The gate insulating layer 22 has a silicon nitride region 22a (first nitride region) and a silicon oxide region 22b (second oxide region). A thickness of the silicon nitride region 22a is, for example, 5 nm or less. A thickness of the silicon oxide region 22b is, for example, 20 nm or more and 50 nm or less. The silicon nitride region 22a is preferably present from the viewpoint of controlling characteristics of the surface of the nitride semiconductor layer 15, which is not indispensable.

The silicon nitride region 22a is disposed between the silicon oxide region 22b and the nitride semiconductor layer 15. The silicon nitride region 22a contains silicon nitride. The silicon nitride region 22a is an example of a first nitride region. The first nitride region may be, for example, a region containing aluminum nitride. The silicon nitride region 22a serves to suppress the surface of the nitride semiconductor layer 15 from being oxidized. However, when an oxide film is formed after an extremely thin silicon nitride film is formed, the oxide film may not remain as the silicon nitride film in the final structure.

The silicon oxide region 22b contains at least any one element of aluminum (Al) and boron (B), gallium (Ga), and silicon (Si). Hereinafter, the case in which at least any one element of aluminum (Al) and boron (B) is aluminum is described by way of example.

The silicon oxide region 22b contains silicon oxide. The silicon oxide region 22b is an example of the first oxide region. The first oxide region contains at least one material selected from the group consisting of, for example, silicon oxide, nitrogen-added silicon oxide, hafnium silicate, nitrogen-added hafnium silicate, zirconium silicate, and nitrogen-added zirconium silicate. The silicon oxide region 22b serves to suppress the leak current between the nitride semiconductor layer 15 and the gate electrode 28.

As shown in FIG. 3, an end portion of the silicon oxide region 22b facing the nitride semiconductor layer 15 is defined as a first end portion (E1 in FIG. 3), an end portion of the silicon oxide region 22b facing the gate electrode 28 is defined as a second end portion (E2 in FIG. 3), a distance between the first end portion and the second end portion is defined as d1, a position separated by d1/10 from the first end portion toward the second end portion is defined as a first position (P1 in FIG. 3), and a position separated by 9×d1/10 from the first end portion toward the second end portion is defined as a second position (P2 in FIG. 3).

The first end portion and the second end portion are defined by the atomic concentration of oxygen and silicon in the gate insulating layer 22. The first end portion is defined as one of position A and position B which is far from the nitride semiconductor layer 15 compared to the other. The position A is a position at which the atomic concentration of oxygen in the gate insulating layer 22 is reduced toward the nitride semiconductor layer 15 to be $1 \times 10^{19}$ cm$^{-3}$. The position B is a position at which the atomic concentration of silicon in the gate insulating layer 22 is reduced toward the nitride semiconductor layer 15 to be $1 \times 10^{19}$ cm$^{-3}$. In addition, the second end portion is defined as one of position C and position D which is far from the gate electrode 28 compared to the other. The position C is a position at which the atomic concentration of oxygen in the gate insulating layer 22 is reduced toward the gate electrode 28 to be $1 \times 10^{19}$ cm$^{-3}$. The position D is a position at which the atomic concentration of silicon in the gate insulating layer 22 is reduced toward the gate electrode 28 to be $1 \times 10^{19}$ cm$^{-3}$. In other words, the silicon oxide region 22b is defined as a region in which the atomic concentration of oxygen and silicon in the gate insulating layer 22 is $1 \times 10^{19}$ cm$^{-3}$ or more.

FIG. 4 is an explanatory diagram of the gate structure according to the first embodiment. FIG. 4 is a concentration profile of gallium and aluminum in a depth direction of the gate structure.

In FIG. 4, the atomic concentration distribution of gallium is shown by a dotted line and the atomic concentration distribution of aluminum is shown by a solid line. In FIG. 4, an error bar provided in the atomic concentration distribution of aluminum shows a range of ±20%. The atomic concentration of gallium at the first position of the silicon oxide region 22b is 80% or more and 120% or less of the atomic concentration of aluminum. In addition, the atomic concentration of gallium at any position between the first position and the second position is 80% or more and 120% or less of the atomic concentration of aluminum.

For example, a measurement error tends to be large upon the atomic concentration analysis by SIMS or the like at an interface between the silicon oxide region 22b and the silicon nitride region 22a or an interface between the silicon oxide region 22b and the gate electrode 28. For example, in the case of the SIMS, the measurement precision is reduced in the vicinity of the interface due to a matrix effect of the interface. Therefore, in the first embodiment, to define the atomic concentrations of gallium and aluminum, the first position and the second position separated by a predetermined distance from the first end portion and the second end portion are used. In the region between the first position and the first end portion or the region between the second position and the second end portion, it does not exclude a case that the relationship of the atomic concentration is established.

The atomic concentration of gallium at the first position of the silicon oxide region 22b is, for example, 90% or more and 110% or less of the atomic concentration of aluminum. In addition, the atomic concentration of gallium at any position between the first position and the second position is, for example, 90% or more and 110% or less of the atomic concentration of aluminum.

The atomic concentration distribution of gallium and the atomic concentration distribution of aluminum in the silicon oxide region 22b, for example, substantially match each other.

The silicon oxide region 22b contains tetracoordinate aluminum bonded to four oxygens. In other words, the silicon oxide region 22b has aluminum atom which substitute a silicon site of silicon oxide.

The silicon oxide region 22b includes a complex of aluminum and gallium. The complex of aluminum and gallium has a pair structure of aluminum and gallium in which the aluminum and the gallium are close to each other and electrons are exchanged. An interaction is generated between the aluminum and the gallium that form the complex. For example, the complex of aluminum and gallium is formed over the whole of the silicon oxide region 22b.

The atomic concentration of aluminum in the silicon oxide region 22b is, for example, $1 \times 10^{17}$ cm$^{-3}$ or more and $2 \times 10^{20}$ cm$^{-3}$ or less. The atomic concentration of gallium in the silicon oxide region 22b is, for example, $1 \times 10^{17}$ cm$^{-3}$ or more and $2 \times 10^{20}$ cm$^{-3}$ or less.

The atomic concentration of the element in each region, or the thickness of each region in the gate insulating layer 22 can be measured by, for example, secondary ion mass spectrometry (SIMS). In addition, the thickness of each region in the gate insulating layer 22 can be measured by, for example, a transmission electron microscope (TEM). In addition, it is possible to detect whether or not aluminum bonded to four oxygens exists in the silicon oxide region 22b by, for example, X-ray photoelectron spectroscopy (XPS). In addition, it is possible to detect whether or not aluminum and gallium form a complex by, for example, the XPS or Fourier transform infrared spectroscopy (FTIR).

Hereinafter, a function and an effect of the first embodiment are described. In the HEMT using the nitride semiconductor having the gate insulating layer, there is a problem in that a threshold voltage is fluctuated and reliability of the HEMT is reduced due to application of a voltage stress. It is considered that the fluctuation in the threshold voltage is due to the existence of an energy level at which electrons in the gate insulating layer are trapped, or the movement of impurities such as aluminum or gallium in the gate insulating layer. In the first embodiment, by forming the pair structure (complex) of aluminum and gallium in the gate insulating layer, the energy level in the gate insulating layer is reduced and the movement of impurities is suppressed, which is described below in detail.

Figure 5A:
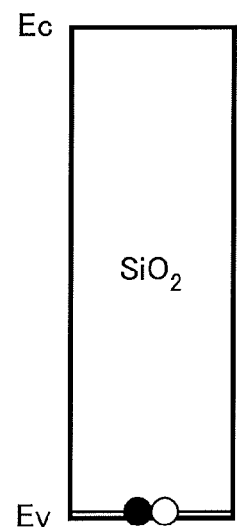
FIGS. 5A and 5B are explanatory diagrams of a function and an effect of the semiconductor device according to the first embodiment.
Figure 5B:
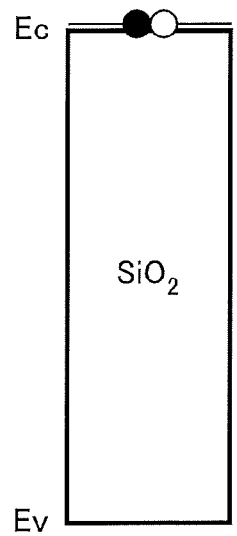

FIGS. 5A and 5B are explanatory diagrams of the function and the effect of the semiconductor device according to the first embodiment. FIG. 5A is a band diagram in the case in which aluminum enters silicon oxide ($SiO_2$). FIG. 5B is a band diagram in the case in which gallium enters silicon oxide.

As a result of a first principle calculation by the inventor, it becomes clear that aluminum and boron are most stable in silicon oxide in terms of energy by entering a silicon site of the silicon oxide. In other words, aluminum and boron become more stable by entering the silicon site of the silicon oxide than entering the oxygen site of the silicon oxide or existing between lattices of the silicon oxide.

Since aluminum enters the silicon site of the silicon oxide, the aluminum is bonded to four oxygens. As shown in FIG. 5A, the aluminum entering the silicon site forms an energy level in the vicinity of an upper end of a valence band of the silicon oxide. There is a risk that electrons are trapped in the formed energy level to generate negative charges and the threshold voltage of the HEMT is fluctuated. The negative charge causes a positive threshold voltage shift. Boron in the silicon oxide also behaves like aluminum.

As a result of the first principle calculation by the inventor, it became clear that gallium is most stable in the silicon oxide in terms of energy by existing between the lattices of the silicon oxide. In other words, the gallium become more stable by existing between the lattices of the silicon oxide than entering the oxygen site of the silicon oxide or entering the silicon site of the silicon oxide.

As shown in FIG. 5B, the gallium existing between the lattices of the silicon oxide forms an energy level in the vicinity of a lower end of a conduction band of the silicon oxide. Gallium emits electrons to become a positive charge, and the threshold voltage of the HEMT fluctuates. The positive charge causes a negative threshold voltage shift.

Since gallium is stable in terms of energy by existing between the lattices, the gallium easily moves in the silicon oxide. Since gallium has a reduced radius by emitting electrons, the gallium is easily diffused. Therefore, gallium may be positively charged mobile ion. Since a threshold voltage is changed even by ion movement, it is preferable to eliminate the mobility.

For example, the nitride semiconductor layer containing aluminum or gallium serves as a supply source of aluminum or gallium, and the aluminum or the gallium are diffused into the gate insulating layer during the manufacturing of the HEMT. The aluminum or the gallium in the gate insulating layer generates negative charges or positive charges during the operation of the HEMT, such that the threshold voltage is fluctuated and the reliability of the HEMT is reduced.

Figure 6A:
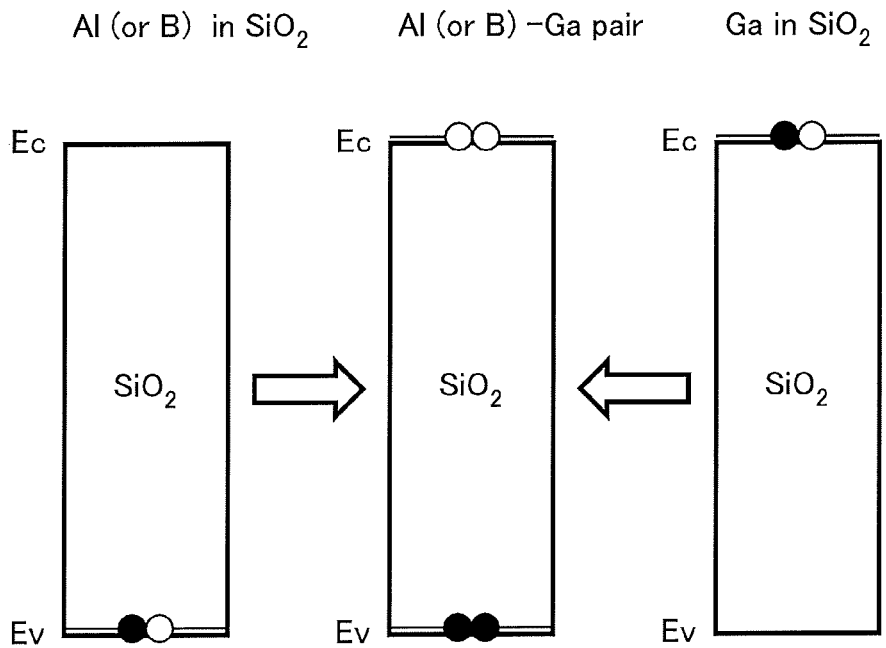
FIGS. 6A and 6B are explanatory diagrams of the function and effect of the semiconductor device according to the first embodiment.
Figure 6B:
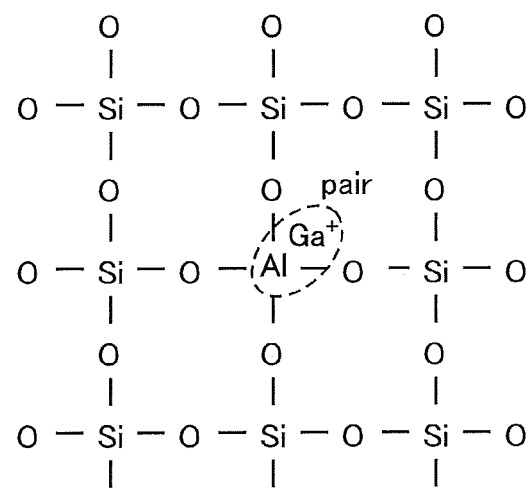

FIGS. 6A and 6B are explanatory diagrams of the function and the effect of the semiconductor device according to the first embodiment. FIGS. 6A and 6B are explanatory diagrams of the pair structure of aluminum and gallium. FIG. 6A is a band diagram, and FIG. 6B is a diagram showing a bonded state of atoms.

As a result of the first principle calculation by the inventor, it became clear that the aluminum and the boron in the silicon oxide form the pair structure with the gallium and thus are stabilized. Compared with the case in which the aluminum and the boron exist alone, in the case in which the aluminum and the boron form the pair structure, the aluminum obtains an energy gain of 5.3 eV and the boron obtains an energy gain of 5.2 eV.

As shown in FIG. 6A, electrons from the gallium existing between the lattices of the silicon oxide are transferred to the energy level formed by the aluminum or the boron. By doing so, electrons become electrically neutral by charge compensation. In addition, the energy level at which electrons are trapped also disappears from the gate insulating layer. In other words, the aluminum, the boron and the gallium in the silicon oxide are rendered harmless.

As shown in FIG. 6B, in the pair structure of aluminum and gallium, the aluminum and the gallium are close to each other, the aluminum is disposed at the silicon site of the silicon oxide, and the gallium is disposed between the lattices. Instead of aluminum, the same goes for the boron.

Once the pair structure of aluminum and gallium is formed, the aluminum and the gallium become stable in terms of energy. For this reason, the pair structure is maintained even when the voltage stress is applied later. In other words, before the pair structure is generated, the gallium as the mobile ion is fixed.

By forming the pair structure of aluminum and gallium, the fluctuation in the threshold voltage is suppressed, and the HEMT 100 with high reliability is realized.

The pair structure of aluminum and gallium of the HEMT 100 can be formed by, for example, the following method.

The HEMT 100 is manufactured by the known manufacturing method except for the distribution of aluminum and gallium in the gate insulating layer 22. Thereafter, for example, the voltage stress that alternately changes polarity of a voltage between the gate electrode 28 and the source electrode 18 is applied. By the application of the voltage stress, the gallium between the lattices, which is ionized and has a positive charge, changes its direction and is diffused into the gate insulating layer 22. The gallium moving in the gate insulating layer 22 forms the pair structure with the aluminum in the gate insulating layer 22 to be stabilized. By forming the pair structure, the aluminum and the gallium in the gate insulating layer 22 are rendered harmless.

According to the first embodiment, the pair structure of gallium and aluminum is formed by using the fact that gallium easily moves in the silicon oxide.

For example, the structure and the manufacturing process of the HEMT are designed so that the amount of gallium in the gate insulating layer 22 is larger than the amount of aluminum. Then, the aluminum in the gate insulating layer 22 can form all the pair structures with the gallium. The surplus gallium can be excluded from the gate insulating layer 22 by, for example, the application of voltage or the thermal diffusion.

The voltage condition of the voltage stress and the change frequency of polarity may be appropriately selected so that the fluctuation in the threshold voltage falls within the required specifications. The voltage stress is preferably applied at a high temperature of, for example, 100° C. or higher and 200° C. or lower from the viewpoint of promoting the diffusion of gallium.

The atomic concentration of gallium at the first position of the silicon oxide region 22b of the HEMT 100 according to the first embodiment is 80% or more and 120% or less of the atomic concentration of aluminum, and preferably 90% or more and 110% or less. If the energy level caused by the aluminum or the gallium exists in the silicon oxide region 22b, in particular, in a portion close to the nitride semiconductor layer 15, the change in characteristics of the HEMT 100 is greatly affected. Therefore, the pair structure is preferably formed at the portion close to at least the nitride semiconductor layer 15. The pair structure is formed in the silicon oxide region 22b, in particular, at the portion close to the nitride semiconductor layer 15, such that the aluminum or the gallium becomes harmless. As a result, the fluctuation in the threshold voltage is suppressed.

The atomic concentration of gallium at any position between the first position and the second position is preferably 80% or more and 120% or less of the atomic concentration of aluminum, more preferably 90% or more and 110% or less. As the concentration distribution falls within the above range, most of the aluminum and the gallium in the silicon oxide region 22b form the pair structure and are harmless. As a result, the fluctuation in the threshold voltage is suppressed. From the viewpoint of suppressing the fluctuation in the threshold voltage, it is more preferable that the atomic concentration of gallium and the atomic concentration of aluminum substantially match each other. As described above, the matching can be realized by repeating the diffusion of gallium by the voltage application.

Modification of First Embodiment

A semiconductor device of the present modification is different from that of the first embodiment in that the semiconductor device includes an aluminum oxide region in addition to a silicon nitride region and a silicon oxide region.

Figure 7:
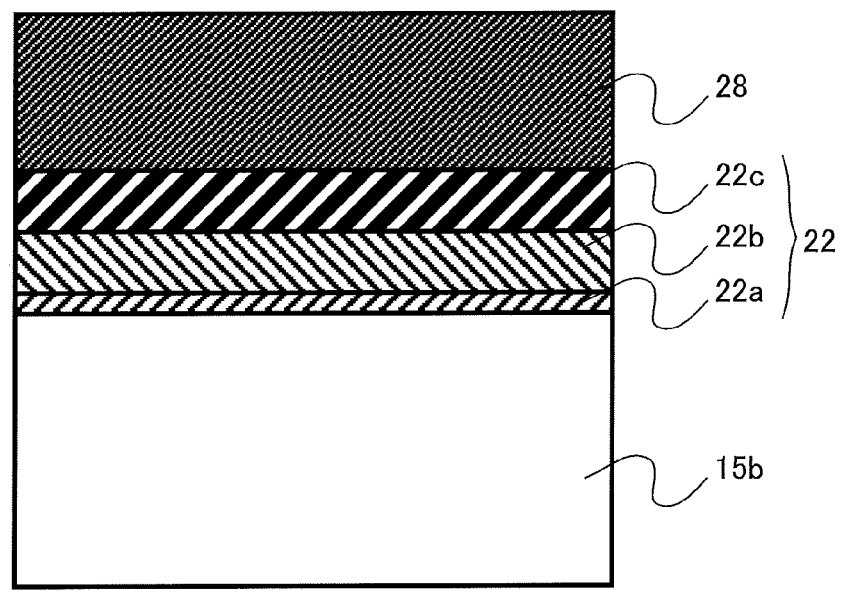
FIG. 7 is an explanatory diagram of a gate structure according to a modification of the first embodiment.
Figure 8:
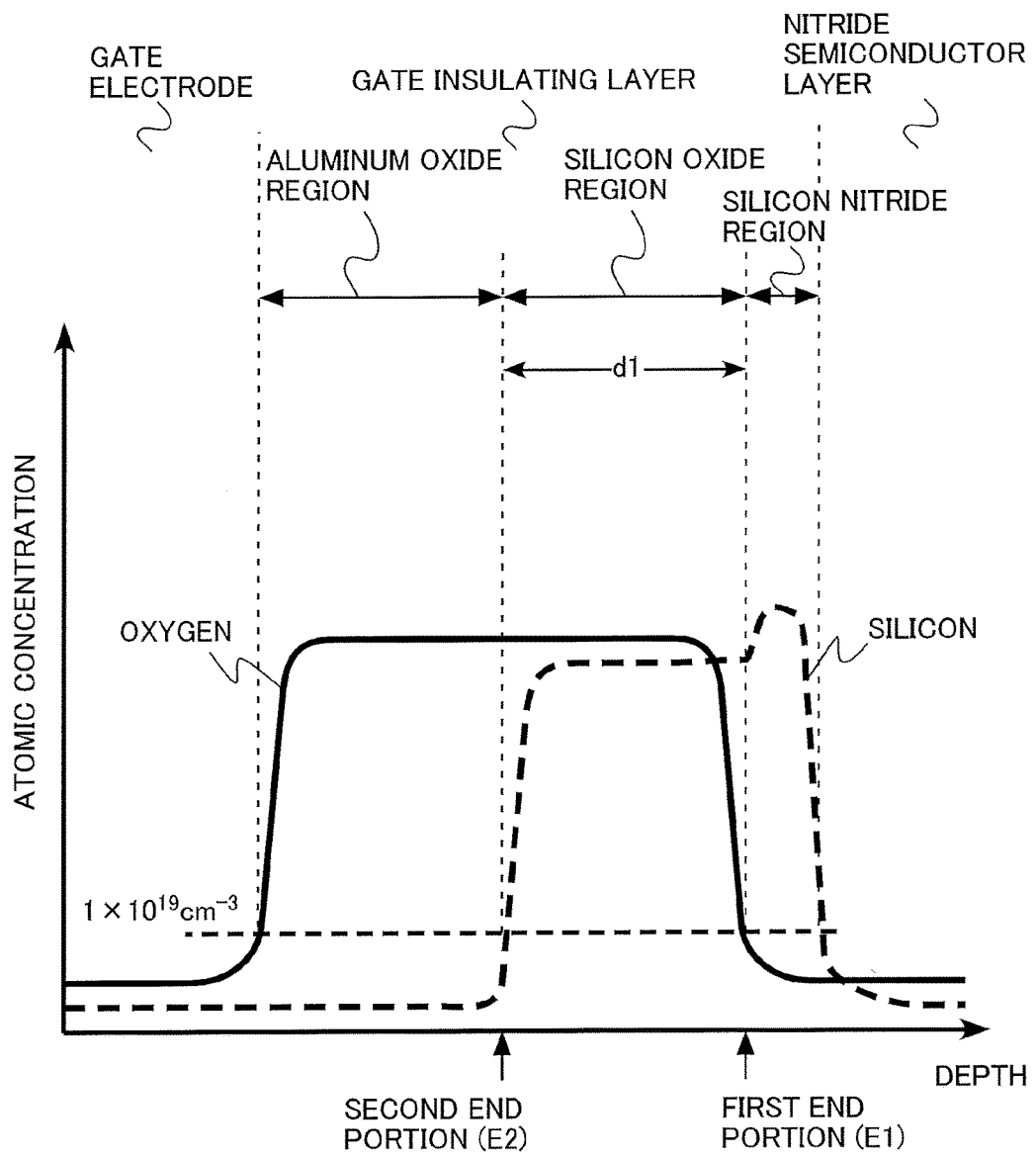
FIG. 8 is an explanatory diagram of the gate structure according to the modification of the first embodiment.

FIGS. 7 and 8 are explanatory diagrams of a gate structure according to the present modification. FIG. 7 is a schematic enlarged cross-sectional view of the gate structure. FIG. 8 is an atomic concentration profile of oxygen in a depth direction of the gate structure. The depth direction is a direction from a gate electrode 28 toward a nitride semiconductor layer 15.

As shown in FIG. 7, the gate insulating layer 22 has a silicon nitride region 22a (first nitride region), a silicon oxide region 22b (second oxide region), and an aluminum oxide region 22c.

Since the gate insulating layer 22 includes the aluminum oxide region 22c, for example, a breakdown voltage of the gate insulating layer 22 is increased. In addition, for example, the gate insulating layer 22 having a high dielectric constant can be realized.

As shown in FIG. 8, an end portion of the silicon oxide region 22b facing the nitride semiconductor layer 15 is defined as a first end portion (E1 in FIG. 8), an end portion of the silicon oxide region 22b facing the gate electrode 28 is defined as a second end portion (E2 in FIG. 8). In other words, an end portion of the silicon oxide region 22b facing the aluminum oxide region 22c is defined as a second end portion (E2 in FIG. 8).

As described above, the first end portion and the second end portion are defined by the atomic concentration of oxygen and silicon in the gate insulating layer 22. In the case of the present modification, the first end portion is defined as one of position A and position B which is far from the nitride semiconductor layer 15 compared to the other. The position A is a position at which the atomic concentration of oxygen in the gate insulating layer 22 is reduced toward the nitride semiconductor layer 15 to be $1\times10^{19}$ cm$^{-3}$. The position B is a position at which the atomic concentration of silicon in the gate insulating layer 22 is reduced toward the nitride semiconductor layer 15 to be $1\times10^{19}$ cm$^{-3}$. In addition, the second end portion is defined as one of position C and position D which is far from the gate electrode 28 compared to the other. The position C is a position at which the atomic concentration of oxygen in the gate insulating layer 22 is reduced toward the gate electrode 28 to be $1\times10^{19}$ cm$^{-3}$. The position D is a position at which the atomic concentration of silicon in the gate insulating layer 22 is reduced toward the aluminum oxide region 22c to be $1\times10^{19}$ cm$^{-3}$. In other words, the silicon oxide region 22b is defined as a region in which the atomic concentration of oxygen and silicon in the gate insulating layer 22 is $1\times10^{19}$ cm$^{-3}$ or more.

Instead of aluminum oxide, for example, nitrogen-added aluminum oxide, hafnium oxide, nitrogen-added hafnium oxide, zirconium oxide, nitrogen-added zirconium oxide or the like can also be applied.

According to the first embodiment and the modification, the fluctuation in the threshold voltage is suppressed by forming the pair structure of gallium and at least one element of aluminum and boron in the gate insulating layer. Therefore, the semiconductor device having high reliability is realized.

Second Embodiment

A semiconductor device according to a second embodiment is the same as that of the first embodiment except that the gate electrode has polycrystalline silicon containing gallium or polycrystalline silicon carbide containing gallium. Therefore, the contents overlapping with the first embodiment are not described.

Figure 9:
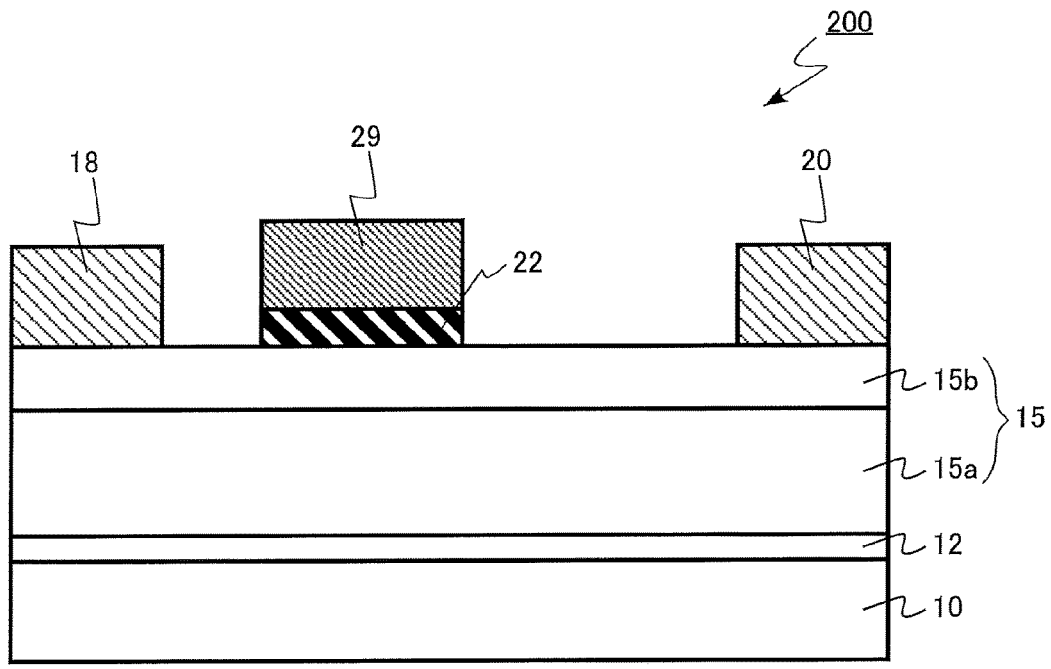
FIG. 9 is a schematic cross-sectional view of a semiconductor device according to a second embodiment.

FIG. 9 is a schematic cross-sectional view of the semiconductor device according to the second embodiment. The semiconductor device according to the second embodiment is an HEMT 200 using a III-V group semiconductor.

As shown in FIG. 9, the HEMT (semiconductor device) 200 includes a substrate 10, a buffer layer 12, a nitride semiconductor layer 15, a source electrode 18 (first electrode), a drain electrode 20 (second electrode), agate insulating layer 22, and a gate electrode 29. The nitride semiconductor layer 15 includes a channel layer 15a (first nitride semiconductor region) and a barrier layer 15b (second nitride semiconductor region).

The gate electrode 29 of the HEMT 200 according to the second embodiment has polycrystalline silicon containing gallium or polycrystalline silicon carbide containing gallium. The gate electrode 29 according to the second embodiment is, for example, polycrystalline silicon containing gallium or polycrystalline silicon carbide containing gallium.

The gallium is easily segregated into the polycrystalline silicon and the polycrystalline silicon carbide than the silicon oxide.

According to the HEMT 200 of the second embodiment, for example, when a voltage stress forming a pair structure is applied, it is possible to absorb surplus gallium in the silicon oxide region 22b into the gate electrode 29. For example, after the voltage stress forming the pair structure is applied, a voltage which makes the gate electrode 29 side into a negative voltage is applied for a long time to absorb ionized gallium which is a positive charge into the gate electrode 29. After the absorption, if necessary, the HEMT 200 may be annealed at a temperature of about 800° C. or higher and 1050° C. or lower under the nitrogen atmosphere or the argon atmosphere to activate the gallium.

Since the surplus gallium is absorbed into the gate electrode 29, the amount of gallium that does not form the pair structure in the silicon oxide region 22b is reduced. Therefore, the reliability of the HEMT 200 is improved.

When the polycrystalline silicon carbide is included in the gate electrode 29, the polycrystalline silicon carbide is preferably 3C—SiC. The 3C—SiC can be formed at a temperature lower than that of 4H—SiC or 6H—SiC. Therefore, it is easy to apply the 3C—SiC to the HEMT 200.

The gate electrode 29 is preferably p-type polycrystalline silicon containing gallium and boron or p-type polycrystalline silicon carbide containing gallium and boron or gallium and aluminum. For example, the boron is diffused from the gate electrode 29 into the silicon oxide region 22b during the manufacturing of the HEMT 200. The diffused boron forms the pair structure with the gallium in the silicon oxide region 22b and makes the gallium in the silicon oxide region 22b harmless. As a result, the fluctuation in the threshold voltage is suppressed.

In addition, the gate electrode 29 is preferably the p-type polycrystalline silicon or the p-type polycrystalline silicon carbide. By using the p-type polycrystalline silicon or the p-type polycrystalline silicon carbide, the band of the channel layer 15a is lifted up to raise the threshold voltage of the HEMT 200. Therefore, it is easy to realize a normally-off HEMT 200.

According to the second embodiment, the fluctuation in the threshold voltage is further suppressed as compared with the first embodiment. Therefore, the semiconductor device having higher reliability is realized. In addition, the normally-off semiconductor device can be easily realized.

Third Embodiment

A semiconductor device according to a third embodiment further includes an insulating layer disposed between a gate electrode and a second electrode on a nitride semiconductor layer and having a second oxide region containing gallium (Ga), silicon (Si), and at least any one element of aluminum (Al) and boron (B), and a third electrode having the insulating layer disposed between the third electrode and the nitride semiconductor layer and electrically connected to the gate electrode. When an end portion of a side of the nitride semiconductor layer of the second oxide region is defined as a third end portion, an end portion of a side of the third electrode of the second oxide region is defined as a fourth end portion, a distance between the third end portion and the fourth end portion is defined as d2, and a position separated by d2/10 from the third end portion toward the fourth end portion is defined as a third position, an atomic concentration of gallium at the third position is 80% or more and 120% or less of that of the at least any one element. The third embodiment is the same as the second embodiment except that the semiconductor device includes the insulating layer and the third electrode. Therefore, the contents overlapping with the second embodiment are not described.

Figure 10:
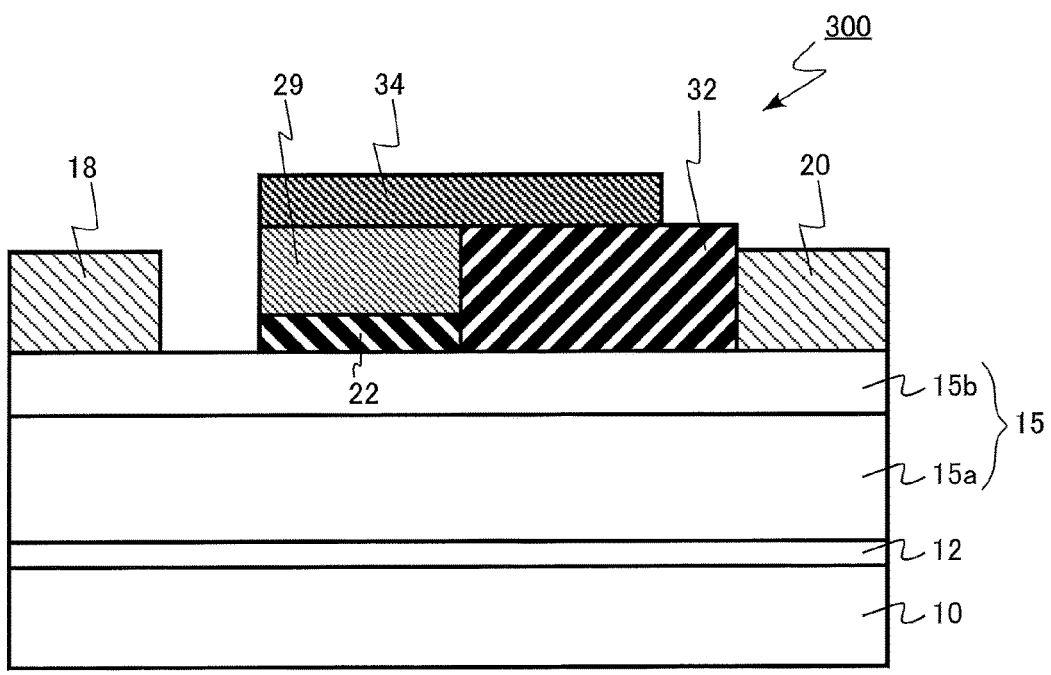
FIG. 10 is a schematic cross-sectional view of a semiconductor device according to a third embodiment.

FIG. 10 is a schematic cross-sectional view of the semiconductor device according to the third embodiment. The semiconductor device according to the third embodiment is an HEMT 300 using a III-V group semiconductor.

As shown in FIG. 10, an HEMT (semiconductor device) 300 includes a substrate 10, a buffer layer 12, a nitride semiconductor layer 15, a source electrode 18 (first electrode), a drain electrode 20 (second electrode), agate insulating layer 22, a gate electrode 29, a protective insulating layer 32 (insulating layer), and a gate field plate electrode 34 (third electrode). The nitride semiconductor layer 15 includes a channel layer 15a (first nitride semiconductor region) and a barrier layer 15b (second nitride semiconductor region).

Figure 11:
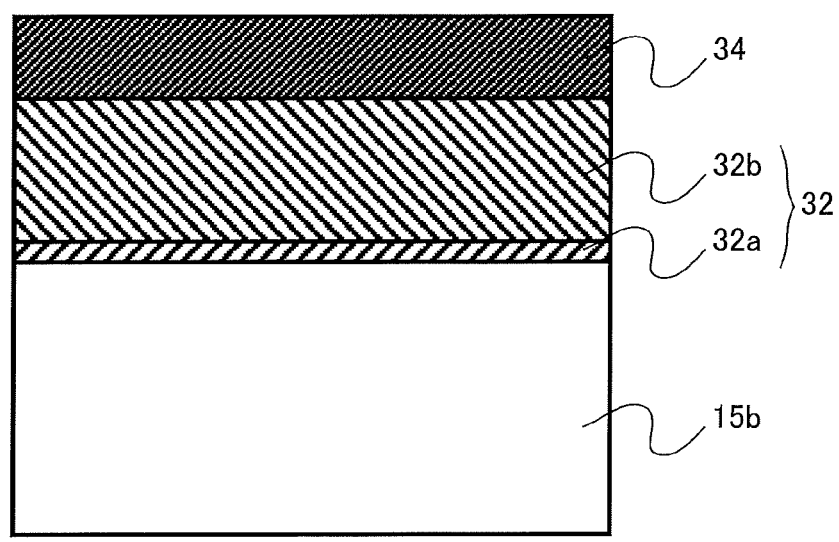
FIG. 11 is an explanatory diagram of a gate field plate structure according to the third embodiment.
Figure 12:
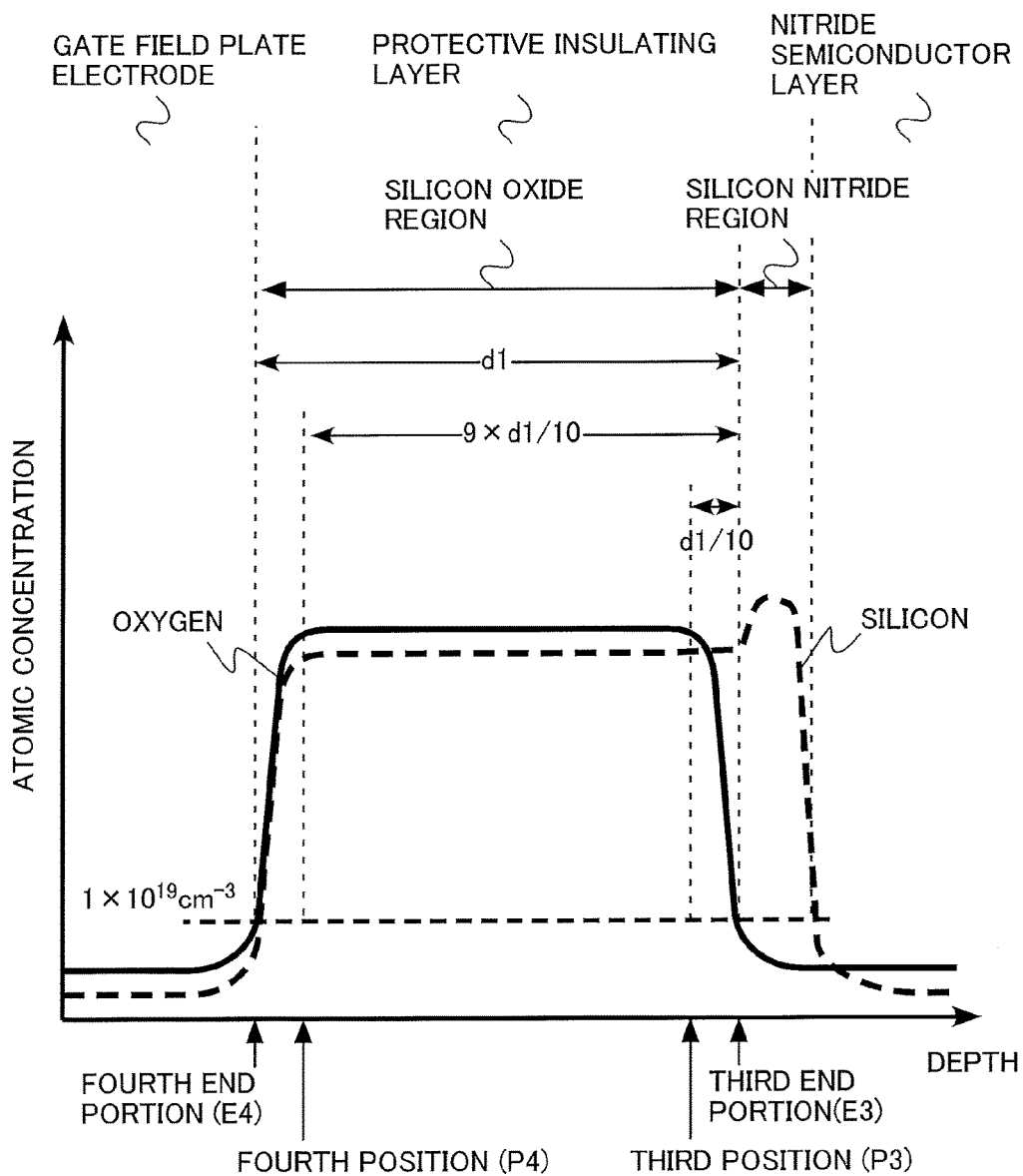
FIG. 12 is an explanatory diagram of the gate field plate structure according to the third embodiment.

FIGS. 11 and 12 are explanatory diagrams of the gate field plate structure according to the third embodiment. FIG. 11 is a schematic enlarged cross-sectional view of the gate field plate structure. FIG. 12 is an atomic concentration profile of oxygen in a depth direction of the gate field plate structure. The depth direction is a direction from the gate field plate electrode 34 toward the nitride semiconductor layer 15.

The protective insulating layer 32 has a silicon nitride region 32a (second nitride region) and a silicon oxide region 32b (second oxide region). A thickness of the silicon nitride region 32a is, for example, 5 nm or less. A thickness of the silicon oxide region 32b is, for example, 20 nm or more and 300 nm or less. The silicon nitride region 32a is preferably present from the viewpoint of controlling characteristics of the surface of the nitride semiconductor layer 15, which is not indispensable.

The silicon nitride region 32a is disposed between the silicon oxide region 32b and the nitride semiconductor layer 15. The silicon nitride region 32a contains silicon nitride. The silicon nitride region 32a is an example of a second nitride region. The second nitride region may be, for example, a region containing aluminum nitride. The silicon nitride region 32a serves to suppress the surface of the nitride semiconductor layer 15 from being oxidized. However, when an oxide film is formed after an extremely thin silicon nitride film is formed, there is a possibility that the final structure does not show a silicon nitride film.

The silicon oxide region 32b contains gallium (Ga), silicon (Si), and at least any one element of aluminum (Al) and boron (B). Hereinafter, the case in which at least any one element of aluminum (Al) and boron (B) is aluminum is described by way of example.

The silicon oxide region 32b contains silicon oxide. The silicon oxide region 32b is an example of the second oxide region. The second oxide region contains at least one material selected from the group consisting of, for example, silicon oxide, nitrogen-added silicon oxide, hafnium silicate, nitrogen-added hafnium silicate, zirconium silicate, and nitrogen-added zirconium silicate. The silicon oxide region 32b serves to protect the nitride semiconductor layer 15.

As shown in FIG. 12, an end portion of a side of the nitride semiconductor layer 15 of the silicon oxide region 32b is defined as a third end portion (E3 in FIG. 12), an end portion of a side of the gate electrode 28 of the silicon oxide region 32b is defined as a fourth end portion (E4 in FIG. 12), a distance between the third end portion and the fourth end portion is defined as d2, a position separated by d2/10 from the third end portion toward the fourth end portion is defined as a third position (P3 in FIG. 12), and a position separated by 9×d2/10 from the third end portion toward the fourth end portion is defined as a fourth position (P4 in FIG. 12).

The third end portion and the fourth end portion are defined as a position at which the atomic concentration of oxygen of the protective insulating layer 32 is $1\times10^{19}$ cm$^{-3}$. In other words, the silicon oxide region 32b is defined as a region in which the atomic concentration of oxygen in the protective insulating layer 32 is $1\times10^{19}$ cm$^{-3}$ or more.

Figure 13:
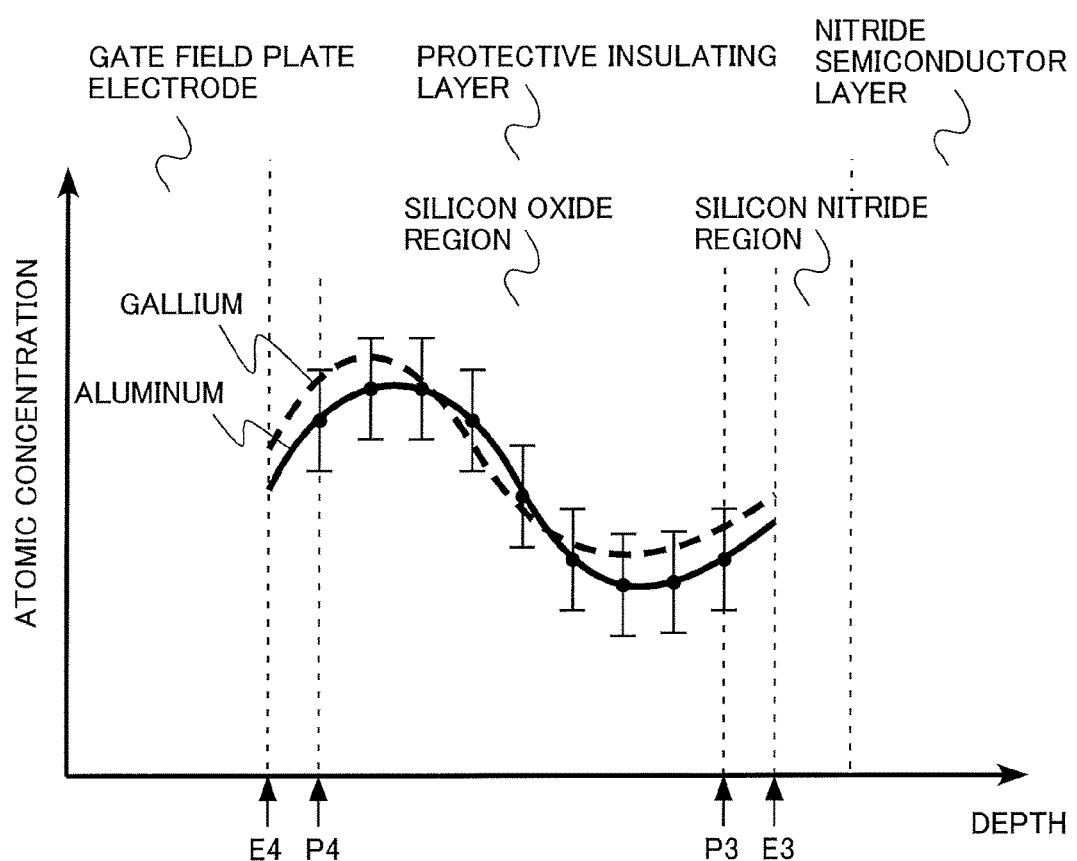
FIG. 13 is an explanatory diagram of the gate field plate structure according to the third embodiment.

FIG. 13 is an explanatory diagram of the gate field plate structure according to the third embodiment. FIG. 13 is a concentration profile of gallium and aluminum in the depth direction of the gate field plate structure.

In FIG. 13, the atomic concentration distribution of gallium is shown by a dotted line and the atomic concentration distribution of aluminum is shown by a solid line. In FIG. 13, an error bar provided in the atomic concentration distribution of aluminum in FIG. 13 shows a range of ±20%. The atomic concentration of gallium at the third position of the silicon oxide region 32b is 80% or more and 120% or less of the atomic concentration of aluminum. In addition, the atomic concentration of gallium at any position between the third position and the fourth position is 80% or more and 120% or less of the atomic concentration of aluminum.

The atomic concentration of gallium at the third position of the silicon oxide region 32b is, for example, 90% or more and 110% or less of the atomic concentration of aluminum. In addition, the atomic concentration of gallium at any position between the third position and the fourth position is 90% or more and 110% or less of the atomic concentration of aluminum.

The atomic concentration distribution of gallium and the atomic concentration distribution of aluminum in the silicon oxide region 32b, for example, substantially match each other.

The silicon oxide region 32b contains tetracoordinate aluminum bonded to four oxygens. In other words, the silicon oxide region 32b has aluminum atom in which a silicon site of silicon oxide is substituted.

The silicon oxide region 32b includes a complex of aluminum and gallium. The complex of aluminum and gallium has a pair structure of aluminum and gallium in which the aluminum and the gallium are close to each other and electrons are exchanged.

The atomic concentration of aluminum in the silicon oxide region 32b is, for example, $1 \times 10^{17}$ cm$^{-3}$ or more and $2 \times 10^{20}$ cm$^{-3}$ or less. The atomic concentration of gallium in the silicon oxide region 32b is, for example, $1 \times 10^{17}$ cm$^{-3}$ or more and $2 \times 10^{20}$ cm$^{-3}$ or less.

The atomic concentration of the elements, or the thickness of each region in the protective insulating layer 32 can be measured by, for example, the SIMS. In addition, the thickness of each region in the protective insulating layer 32 can be measured by, for example, the TEM. In addition, it is possible detect whether or not aluminum bonded to four oxygens exists in the silicon oxide region 32b by, for example, the XPS. In addition, it is possible to detect whether the complex of aluminum and gallium is formed by, for example, the XPS or the FTIR.

Hereinafter, a function and an effect of the third embodiment are described. In the HEMT of the nitride semiconductor, there is a problem of "current collapse" in which an on-resistance is increased when a high drain voltage is applied. It is considered that the "current collapse" mainly occurs by trapping electrons in the protective insulating layer between the gate electrode and the drain electrode. Electrons are accelerated by an electric field between the 2DEG and the drain electrode and trapped in the protective insulating layer.

It is considered that electrons are trapped in the protective insulating layer and thus a potential of a heterojunction interface is fluctuated and the 2DEG density is decreased and thus the on-resistance is increased.

In the HEMT 300 according to the third embodiment, aluminum and gallium in the protective insulating layer 32 form the pair structure as in the gate insulating layer 22 according to the first embodiment and thus are harmless. Therefore, the energy level at which electrons are trapped in the protective insulating layer 32 is reduced. Therefore, the trap of electrons in the protective insulating layer 32 is suppressed and the current collapse is suppressed.

The pair structure of aluminum and gallium in the protective insulating layer 32 can be formed by, for example, applying the voltage stress that alternately changes the polarity of voltage between the gate field plate electrode 34 and the source electrode 18 after the gate field plate structure is formed.

The gate field plate electrode 34 is preferably n-type polycrystalline silicon containing gallium and phosphorous (P) or n-type polycrystalline silicon carbide containing gallium and phosphorous (P) or gallium and arsenic (As). By making phosphorus as an n-type impurity surplus to gallium as a p-type impurity, it is possible to make the gate field plate electrode 34 into an n type.

The gate field plate electrode 34 is preferably the n-type polycrystalline silicon or the n-type polycrystalline silicon carbide. By using the n-type polycrystalline silicon or the n-type polycrystalline silicon carbide, the band of the channel layer 15a is lowered to increase the 2DEG concentration. Therefore, the increase in the on-resistance due to the current collapse hardly occurs.

In the HEMT 300 according to the third embodiment, from the viewpoint of increasing the threshold voltage, the gate electrode 29 is preferably the p-type polycrystalline silicon or the p-type polycrystalline silicon carbide, and from the viewpoint of suppressing the current collapse, the gate field plate electrode 34 is preferably the n-type polycrystalline silicon or the n-type polycrystalline silicon carbide.

According to the third embodiment, the fluctuation in the threshold voltage is suppressed similar to the first and second embodiments. In addition, the increase in the on-resistance due to the current collapse is suppressed. Therefore, the semiconductor device having higher reliability is realized.

Fourth Embodiment

A semiconductor device according to a fourth embodiment is the same as that of the first embodiment except that the semiconductor device further includes a p-type nitride semiconductor layer provided between a gate electrode and a gate insulating layer. Therefore, the contents overlapping with the first embodiment are not described.

Figure 14:
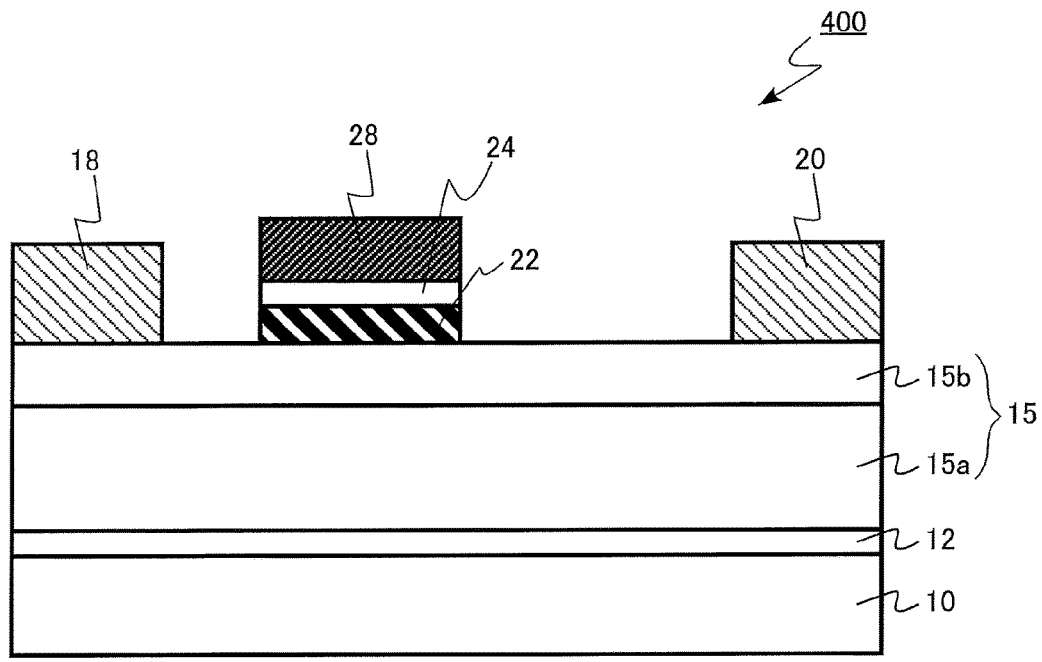
FIG. 14 is a schematic cross-sectional view of a semiconductor device according to a fourth embodiment.

FIG. 14 is a schematic cross-sectional view of the semiconductor device according to the fourth embodiment. The semiconductor device according to the fourth embodiment is an HEMT 400 using a III-V group semiconductor.

As shown in FIG. 14, the HEMT (semiconductor device) 400 includes a substrate 10, a buffer layer 12, a nitride semiconductor layer 15, a source electrode 18 (first electrode), a drain electrode 20 (second electrode), a gate insulating layer 22, a p-type gallium nitride layer 24, and a gate electrode 28. The nitride semiconductor layer 15 includes a channel layer 15a (first nitride semiconductor region) and a barrier layer 15b (second nitride semiconductor region).

The HEMT 400 according to the fourth embodiment has the p-type gallium nitride layer 24. The p-type gallium nitride layer 24 is an example of the p-type nitride semiconductor layer. The p-type gallium nitride layer 24 is provided between the gate electrode 28 and the gate insulating layer 22.

The p-type gallium nitride layer 24 lifts up a band of the channel layer 15a to raise a threshold voltage of the HEMT 400. Therefore, it is easy to realize a normally-off HEMT 400.

According to the fourth embodiment, the fluctuation in the threshold voltage is suppressed like the first embodiment. Therefore, the semiconductor device having high reliability is realized. In addition, the normally-off semiconductor device can be easily realized.

Fifth Embodiment

A semiconductor device according to a fifth embodiment is the same as that of the first embodiment except that the semiconductor device includes a gate recess structure. Therefore, the contents overlapping with the first embodiment are not described.

Figure 15:
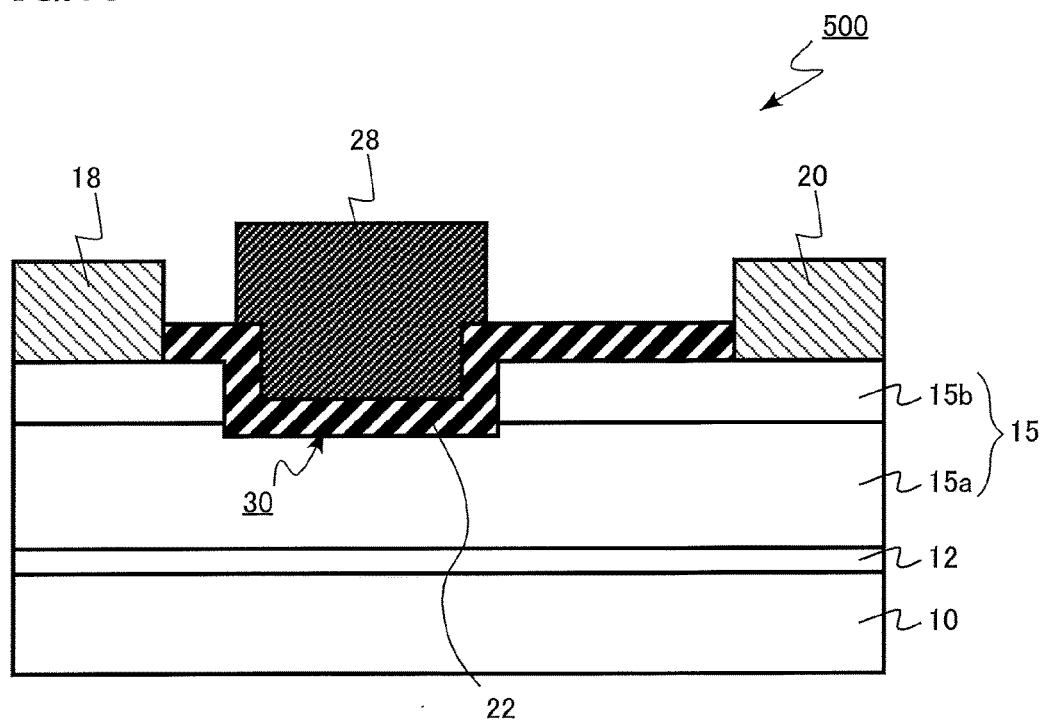
FIG. 15 is a schematic cross-sectional view of a semiconductor device according to a fifth embodiment.

FIG. 15 is a schematic cross-sectional view of the semiconductor device according to the fifth embodiment. The semiconductor device according to the fifth embodiment is an HEMT 500 using a III-V group semiconductor.

As shown in FIG. 15, the HEMT (semiconductor device) 500 includes a substrate 10, a buffer layer 12, a nitride semiconductor layer 15, a source electrode 18 (first electrode), a drain electrode 20 (second electrode), a gate insulating layer 22, a gate electrode 28, and a recess 30. The nitride semiconductor layer 15 includes a channel layer 15*a* (first nitride semiconductor region) and a barrier layer 15*b* (second nitride semiconductor region).

In the HEMT 500 according to the fifth embodiment, a gate insulating layer 22 is formed in the recess 30 provided on the barrier layer 15*b* and the channel layer 15*a* between the source electrode 18 and the drain electrode 20. In addition, the gate electrode 28 is provided in the recess 30.

A bottom of the recess 30 is disposed on the channel layer 15*a*. The gate insulating layer 22 is in contact with the channel layer 15*a* and the gate electrode 28. The gate structure of the HEMT 500 according to the fifth embodiment is a so-called metal oxide semiconductor (MOS) type.

The HEMT 500 includes a MOS-type gate structure, such that the normally-off is easily realized.

According to the fifth embodiment, the fluctuation in the threshold voltage is suppressed like the first embodiment. Therefore, the semiconductor device having high reliability is realized. In addition, the normally-off semiconductor device is easily realized.

Sixth Embodiment

A semiconductor device according to a sixth embodiment is the same as that of the fifth embodiment except that the semiconductor device has a p-type gallium nitride layer 24. Therefore, the contents overlapping with the fifth embodiment are not described.

Figure 16:
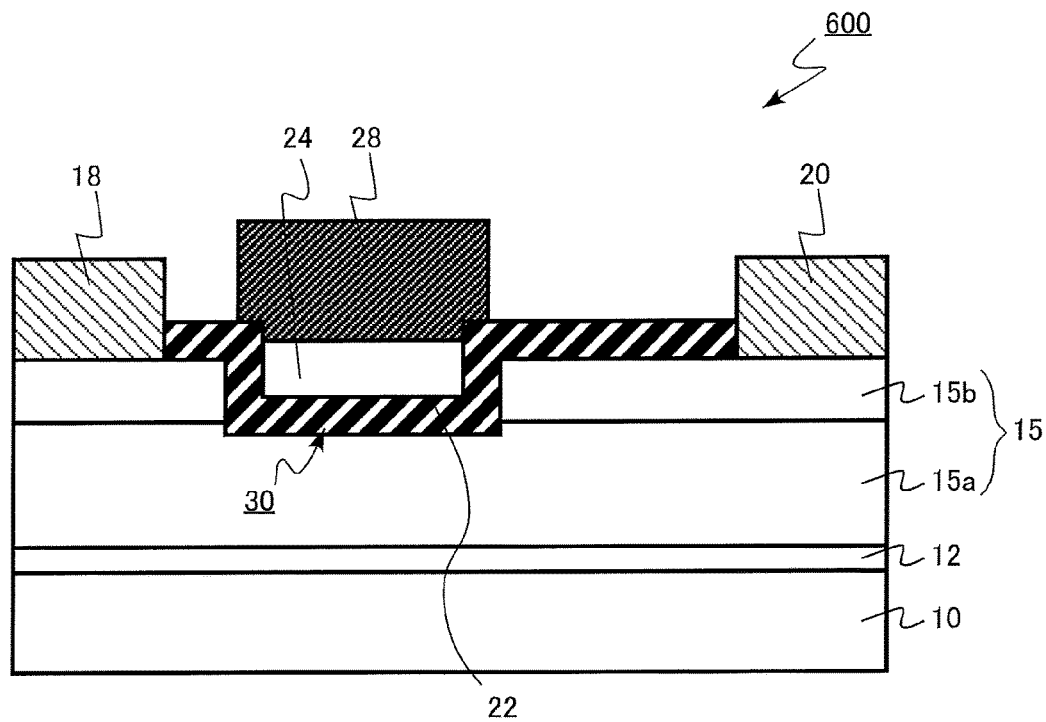
FIG. 16 is a schematic cross-sectional view of a semiconductor device according to a sixth embodiment.

FIG. 16 is a schematic cross-sectional view of the semiconductor device according to the sixth embodiment. The semiconductor device according to the sixth embodiment is an HEMT 600 using a III-V group semiconductor.

As shown in FIG. 16, the HEMT (semiconductor device) 600 includes a substrate 10, a buffer layer 12, a nitride semiconductor layer 15, a source electrode 18 (first electrode), a drain electrode 20 (second electrode), a gate insulating layer 22, a p-type gallium nitride layer 24, a gate electrode 28, and a recess 30. The nitride semiconductor layer 15 includes a channel layer 15*a* (first nitride semiconductor region) and a barrier layer 15*b* (second nitride semiconductor region).

The p-type gallium nitride layer 24 lifts up a band of the channel layer 15*a* to raise a threshold voltage of the HEMT 600. Therefore, the normally-off is more easily realized.

According to the sixth embodiment, the fluctuation in the threshold voltage is suppressed like the fifth embodiment. Therefore, the semiconductor device having high reliability is realized. In addition, the normally-off semiconductor device is more easily realized.

Seventh Embodiment

A semiconductor device according to the seventh embodiment is the same as that of the sixth embodiment except that the bottom of the recess 30 is disposed on the barrier layer 15*b*. Therefore, the contents overlapping with the sixth embodiment are not described.

Figure 17:
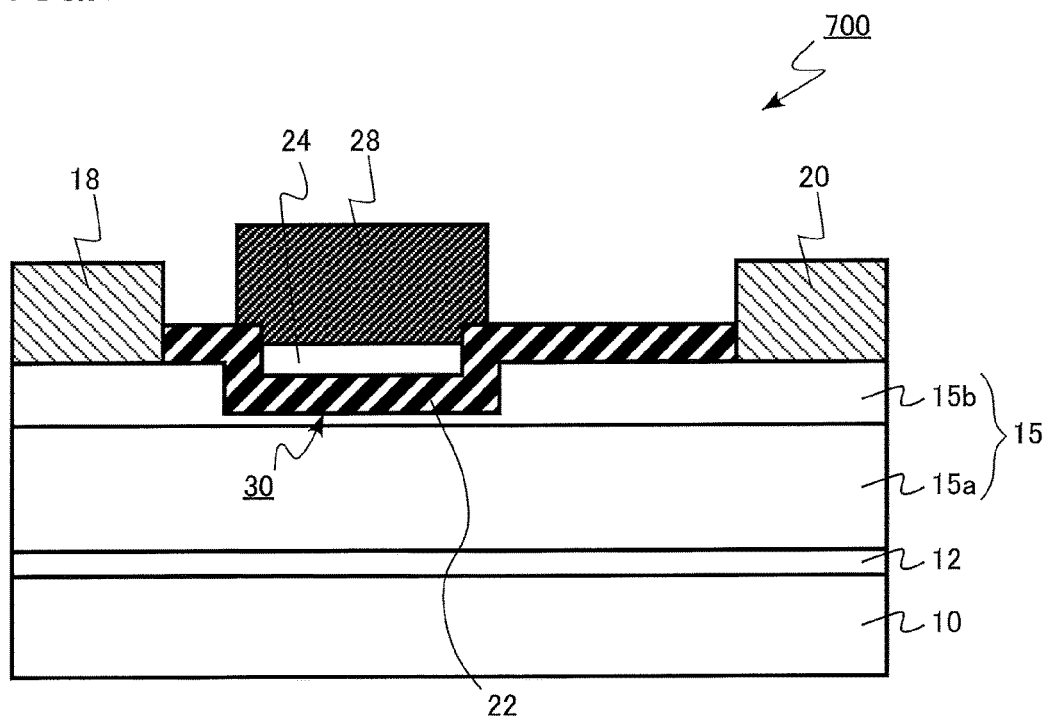
FIG. 17 is a schematic cross-sectional view of a semiconductor device according to a seventh embodiment.

FIG. 17 is a schematic cross-sectional view of the semiconductor device according to the seventh embodiment. The semiconductor device according to the seventh embodiment is an HEMT 700 using a III-V group semiconductor.

As shown in FIG. 17, the HEMT (semiconductor device) 700 includes a substrate 10, a buffer layer 12, a nitride semiconductor layer 15, a source electrode 18 (first electrode), a drain electrode 20 (second electrode), a gate insulating layer 22, a p-type gallium nitride layer 24, a gate electrode 28, and a recess 30. The nitride semiconductor layer 15 includes a channel layer 15*a* (first nitride semiconductor region) and a barrier layer 15*b* (second nitride semiconductor region).

The bottom portion of the recess 30 is disposed on the barrier layer 15*b*. Therefore, a 2DEG is formed under the gate electrode 28. The p-type gallium nitride layer 24 lifts up a band of the channel layer 15*a* to raise a threshold voltage of the HEMT 700. Therefore, the normally-off is easily realized.

According to the seventh embodiment, the fluctuation in the threshold voltage is suppressed like the sixth embodiment. Therefore, the semiconductor device having high reliability is realized. In addition, the normally-off semiconductor device is easily realized.

Eighth Embodiment

A semiconductor device according to an eighth embodiment is different from that of the first embodiment in that the semiconductor device is a vertical type device. The contents overlapping with the first embodiment are not described.

Figure 18:
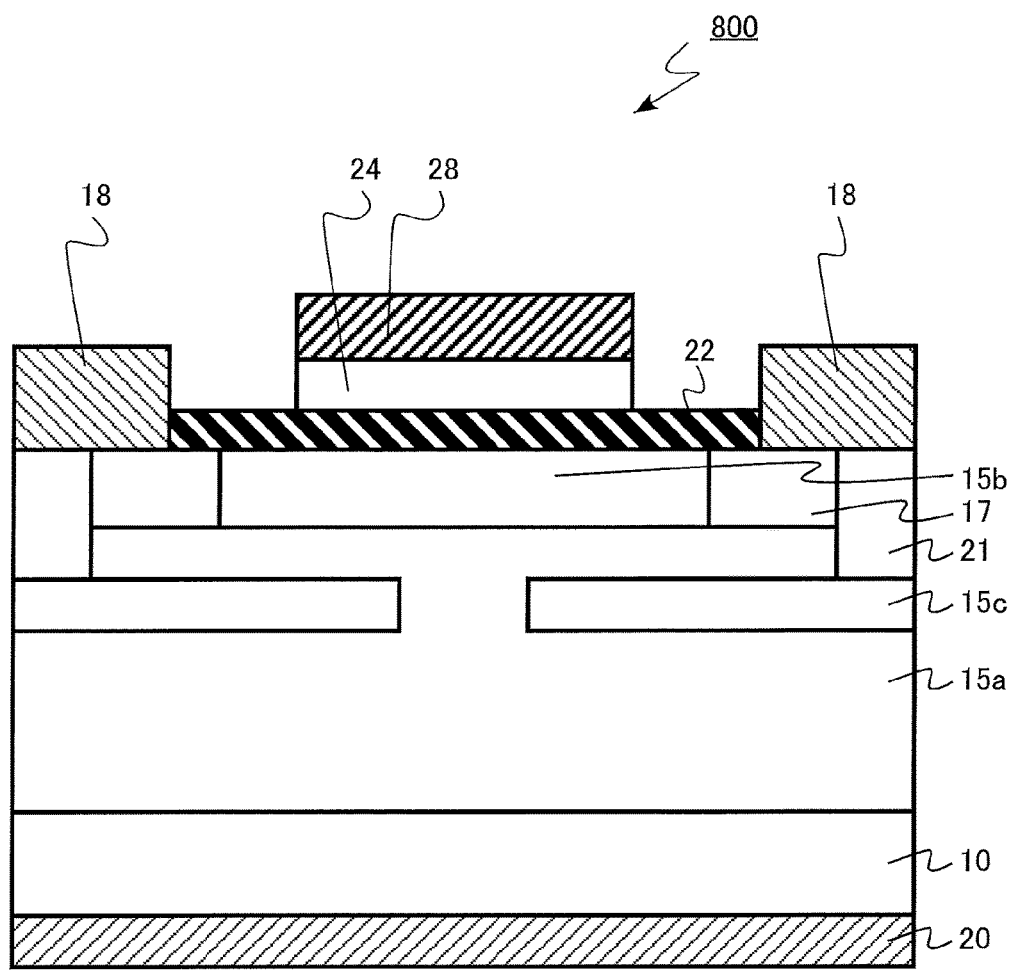
FIG. 18 is a schematic cross-sectional view of a semiconductor device according to an eighth embodiment.

FIG. 18 is a schematic cross-sectional view of the semiconductor device according to the eighth embodiment. The semiconductor device according to the eighth embodiment is an HEMT 800 using a III-V group semiconductor. The semiconductor device according to the eighth embodiment is the vertical HEMT in which a drain electrode is formed on a back surface of the substrate.

As shown in FIG. 18, the HEMT according to the eighth embodiment includes a substrate 10, a channel layer 15*a*, a barrier layer 15*b*, a p-type blocking region 15*c*, a source region 17, a p-type contact region 21, a source electrode 18, a drain electrode 20, a p-type gallium nitride layer 24, a gate electrode 28, and a gate insulating layer 22.

The substrate 10 is, for example, n-type GaN. The channel layer 15*a* is, for example, n-type $Al_XGa_{1-X}N$ ($0 \le X < 1$) having a concentration lower than the substrate 10. The barrier layer 15*b* is made of, for example, undoped $Al_YGa_{1-Y}N$ ($0 < Y \le 1$, X<Y). The p-type blocking region 15*c* is, for example, p-type GaN. The source region 17 is, for example, n-type $Al_YGa_{1-Y}N$ ($0 < Y \le 1$, X<Y). The p-type contact region 21 is, for example, p-type $Al_ZGa_{1-Z}N$ ($0 \le Z < 1$).

In the HEMT according to the eighth embodiment, an on state and an off state of a current flowing from the source electrode 18 toward the drain electrode 20 are controlled by a gate voltage applied to the gate electrode 28.

The p-type blocking region 15*c* serves to block a current by depleting a space between the two p-type blocking regions 15*c* in the off state. The p-type blocking region 15*c* is formed by removing, for example, a portion of the p-type GaN, which is formed by epitaxial growth, by etching.

The p-type contact region 21 serves to electrically conduct the source electrode 18 and the p-type blocking region 15*c*. The p-type contact region 21 may be formed by, for example, ion-implanting magnesium (Mg) and hydrogen (H).

For example, a source field plate (not shown) may also be provided on the barrier layer 15*b* and the source region 17. In addition, a gate field plate (not shown) may also be provided on the source region 17. In addition, the source region 17 may overlap the gate electrode 28.

The HEMT 800 according to the eighth embodiment is formed in the vertical structure to improve, for example, an integration.

According to the eighth embodiment, the fluctuation in the threshold voltage is suppressed like the first embodiment. Therefore, the semiconductor device having high reliability is realized. In addition, the semiconductor device with the improved integration is realized.

Ninth Embodiment

A power supply circuit and a computer according to a ninth embodiment have an HEMT.

Figure 19:
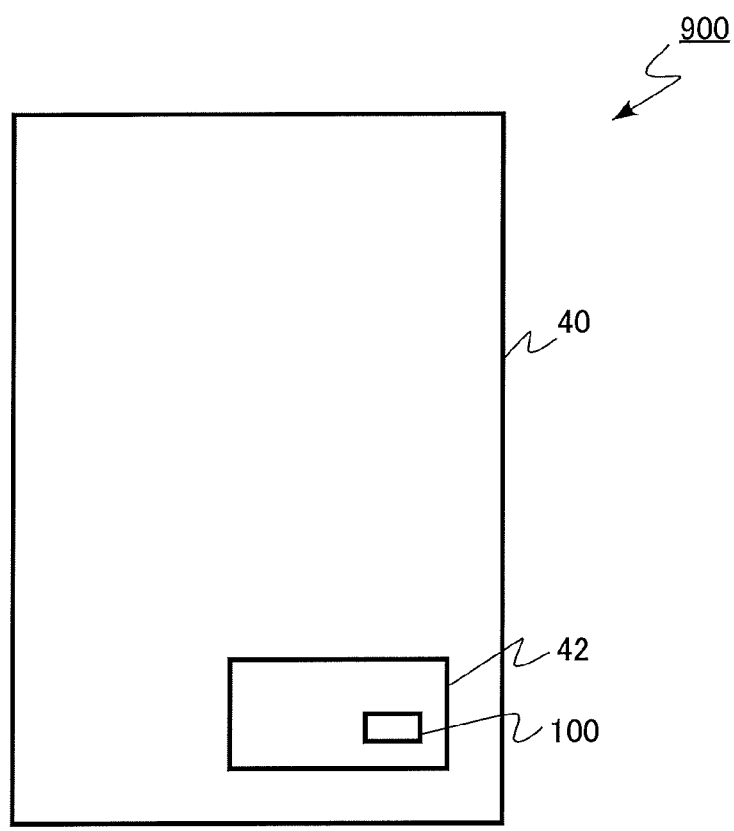
FIG. 19 is a schematic diagram of a computer according to a ninth embodiment.

FIG. 19 is a schematic diagram of the computer according to the ninth embodiment. The computer according to the ninth embodiment is a server 900.

The power supply circuit 42 is provided in a housing 40 of the server 900. The server 900 is a computer that operates server software.

The power supply circuit 42 has the HEMT 100 according to the first embodiment. The HEMT 200, the HEMT 300, the HEMT 400, the HEMT 500, the HEMT 600, the HEMT 700, and the HEMT 800 according to the second to eighth embodiments may be used instead of the HEMT 100. The power supply circuit 42 is, for example, an on-vehicle power supply circuit.

The power supply circuit 42 has the HEMT 100 in which the fluctuation in the threshold voltage is suppressed, and thus the reliability of the power supply circuit 42 is increased. In addition, the server 900 has the power supply circuit 42, and thus the reliability of the server 900 is increased.

According to the ninth embodiment, the power supply circuit and the computer with high reliability can be realized.

Although the embodiments describe, for example, the HEMT as the transistor, the present disclosure can also be applied to a transistor having a structure other than the HEMT.

Although the embodiments describe, for example, the gallium nitride or the aluminum gallium nitride as the nitride semiconductor layer, it is possible to apply, for example, indium gallium nitride, indium aluminum nitride, and indium aluminum gallium nitride containing indium (In). In addition, it is also possible to use aluminum nitride as the material of the nitride semiconductor layer.

In addition, although the embodiments describe, for example, the undoped aluminum gallium nitride as the barrier layer 15b, it is possible to apply the n-type aluminum gallium nitride.

While certain embodiments have been described, these embodiments have been presented byway of example only, and are not intended to limit the scope of the inventions. Indeed, a semiconductor device, a power supply circuit, and a computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device, comprising:
a nitride semiconductor layer containing gallium (Ga);
a first electrode disposed on or above the nitride semiconductor layer;
a second electrode disposed on or above the nitride semiconductor layer;
a gate electrode disposed between the first electrode and the second electrode, wherein the gate electrode is separated from the first electrode and the second electrode; and
a gate insulating layer disposed between the nitride semiconductor layer and the gate electrode, the gate insulating layer including a first oxide region containing gallium (Ga), silicon (Si), and at least any one element of aluminum (Al) and boron (B),
wherein when an end portion of the first oxide region facing the nitride semiconductor layer is defined as a first end portion, an end portion of the first oxide region facing the gate electrode is defined as a second end portion, a distance between the first end portion and the second end portion is defined as d1, and a position separated by d1/10 from the first end portion toward the second end portion is defined as a first position, an atomic concentration of gallium at the first position is 80% or more and 120% or less of an atomic concentration of the at least any one element.

2. The semiconductor device of claim 1, wherein when a position separated by 9.times.d1/10 from the first end portion toward the second end portion is defined as a second position, anatomic concentration of gallium at any position between the first position and the second position is 80% or more and 120% or less of an atomic concentration of the at least any one element.

3. The semiconductor device of claim 1, wherein the first oxide region contains the at least any one element bonded to four oxygens.

4. The semiconductor device of claim 1, wherein the first oxide region contains a complex of the at least any one element and gallium.

5. The semiconductor device of claim 1, wherein an atomic concentration of the at least anyone element in the first oxide region is $1 \times 10^{17}$ cm$^{-3}$ or more and $2 \times 10^{20}$ cm$^{-3}$ or less, and an atomic concentration of gallium in the first oxide region is $1 \times 10^{17}$ cm$^{-3}$ or more and $2 \times 10^{20}$ cm$^{-3}$ or less.

6. The semiconductor device of claim 1, wherein a thickness of the first oxide region is 20 nm or more and 50 nm or less.

7. The semiconductor device of claim 1, wherein the first oxide region contains at least one material selected from the group consisting of silicon oxide, nitrogen-added silicon oxide, hafnium silicate, nitrogen-added hafnium silicate, zirconium silicate, and nitrogen-added zirconium silicate.

8. The semiconductor device of claim 1, wherein the gate insulating layer includes a first nitride region disposed between the first oxide region and the nitride semiconductor layer.

9. The semiconductor device of claim 1, wherein the gate electrode includes polycrystalline silicon containing gallium, or polycrystalline silicon carbide containing gallium.

10. The semiconductor device of claim 1, wherein the gate electrode includes p-type polycrystalline silicon containing gallium and boron, p-type polycrystalline silicon carbide containing gallium and boron, or p-type polycrystalline silicon carbide containing gallium and aluminum.

11. The semiconductor device of claim 1, further comprising:
an insulating layer disposed between the gate electrode and the second electrode, the insulating layer disposed on or above the nitride semiconductor layer, and the insulating layer including a second oxide region containing gallium (Ga), silicon (Si), and at least any one element of aluminum (Al) and boron (B); and a third electrode having the insulating layer disposed between the third electrode and the nitride semiconductor layer, the third electrode being electrically connected to the gate electrode, wherein when an end portion of the second oxide region facing the nitride semiconductor layer is defined as a third end portion, an end portion of the second oxide region facing the third electrode is defined as a fourth end portion, a distance between the third end portion and the fourth end portion is defined as d2, and a position separated by d2/10 from the third end portion toward the fourth end portion is defined as a third position, an atomic concentration of gallium at the third position is 80% or more and 120% or less of an atomic concentration of the at least any one element.

12. The semiconductor device of claim 11, wherein when a position separated by 9.times.d2/10 from the third end portion toward the fourth end portion is defined as a fourth position, anatomic concentration of gallium at any position between the third position and the fourth position is 80% or more and 120% or less of an atomic concentration of the at least any one element.

13. The semiconductor device of claim 11, wherein the third electrode includes n-type polycrystalline silicon containing gallium and phosphorous (P), n-type polycrystalline silicon carbide containing gallium and phosphorous (P), or n-type polycrystalline silicon carbide containing gallium and arsenic (As).

14. A semiconductor device, comprising:
a nitride semiconductor layer containing gallium (Ga);
a first electrode disposed on one side of the nitride semiconductor layer;
a second electrode disposed on the other side of the nitride semiconductor layer;
a gate electrode disposed on the one side of the nitride semiconductor layer, wherein the gate electrode is separated from the first electrode and the second electrode; and a gate insulating layer disposed between the nitride semiconductor layer and the gate electrode, the gate insulating layer including a first oxide region containing gallium (Ga), silicon (Si), and at least any one of aluminum (Al) and boron (B), wherein when an end portion of the first oxide region facing the nitride semiconductor layer is defined as a first end portion, an end portion of the first oxide region facing the gate electrode is defined as a second end portion, a distance between the first end portion and the second end portion is defined as d1, and a position separated by d1/10 from the first end portion toward the second end portion is defined as a first position, an atomic concentration of gallium at the first position is 80% or more and 120% or less of an atomic concentration the at least any one element.

15. The semiconductor device of claim 14, wherein when a position separated by 9×d1/10 from the first end portion toward the second end portion is defined as a second position, anatomic concentration of gallium at any position between the first position and the second position is 80% or more and 120% or less of an atomic concentration of the at least any one element.

16. The semiconductor device of claim 14, wherein the first oxide region contains the at least any one element bonded to four oxygens.

17. The semiconductor device of claim 14, wherein the first oxide region contains a complex of the at least any one element and gallium.

18. The semiconductor device of claim 14, wherein the gate electrode includes p-type polycrystalline silicon containing gallium and boron, p-type polycrystalline silicon carbide containing gallium and boron, or p-type polycrystalline silicon carbide containing gallium and aluminum.

19. A power supply circuit comprising the semiconductor device of claim 1.

20. A computer comprising the semiconductor device of claim 1.

* * * * *